(12) United States Patent
Zhang et al.

(10) Patent No.: US 9,671,438 B2
(45) Date of Patent: Jun. 6, 2017

(54) HIGH-CURRENT SENSING SCHEME USING DRAIN-SOURCE VOLTAGE

(71) Applicant: QUALCOMM Incorporated, San Diego, CA (US)

(72) Inventors: Chuang Zhang, San Diego, CA (US); Zhengming Fu, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 226 days.

(21) Appl. No.: 14/533,950

(22) Filed: Nov. 5, 2014

(65) Prior Publication Data

US 2016/0124030 A1    May 5, 2016

(51) Int. Cl.
    G01R 19/25    (2006.01)
    G01R 19/32    (2006.01)
    G01R 19/00    (2006.01)

(52) U.S. Cl.
    CPC ......... *G01R 19/25* (2013.01); *G01R 19/0092* (2013.01); *G01R 19/32* (2013.01)

(58) Field of Classification Search
    CPC ........ G01R 19/25; G01R 19/32; G01R 19/00; G01R 19/0092
    USPC ....................................................... 324/605
    See application file for complete search history.

(56) References Cited

U.S. PATENT DOCUMENTS

| | | | |
|---|---|---|---|
| 7,183,756 B1 | 2/2007 | Dikken et al. | |
| 7,420,411 B2 | 9/2008 | Herzinger et al. | |
| 7,710,094 B1* | 5/2010 | Wong | H02M 3/156 |
| | | | 323/225 |
| 8,000,072 B2 | 8/2011 | Bauer et al. | |
| 8,385,854 B2 | 2/2013 | Hadjichristos et al. | |
| 8,587,974 B2 | 11/2013 | Jonsson et al. | |
| 2004/0189221 A1 | 9/2004 | Kurosawa et al. | |
| 2004/0263230 A1* | 12/2004 | Mori | H03F 3/45 |
| | | | 327/307 |

(Continued)

FOREIGN PATENT DOCUMENTS

DE    102010028088 A1    10/2011

OTHER PUBLICATIONS

Acker B., et al., "Synchronous Rectification with Adaptive Timing Control," 26th Annual IEEE Power Electronics Specialists Conference, Jun. 18, 1995, vol. 1, pp. 88-95, XP010150543, DOI: 10.1109/PESC.1995.474797, ISBN: 978-0-7803-2730-6 figures 2, 10.

(Continued)

*Primary Examiner* — Son Le
*Assistant Examiner* — Akm Zakaria
(74) *Attorney, Agent, or Firm* — Loza & Loza, LLP

(57) ABSTRACT

In one embodiment, a method for measuring current is described herein. The method comprises shorting first and second inputs of an amplifying circuit to generate a first output signal, and converting the first output signal into an offset cancelation value. The method also comprises passing a current through a power switch, wherein the current generates a voltage drop across the power switch, applying the voltage drop across the first and second inputs of the amplifying circuit to generate a second output signal, and converting the second output signal into a current value. The method further comprises subtracting the offset cancelation value from the current value to generate an offset-compensated current value.

25 Claims, 7 Drawing Sheets

(56) References Cited

U.S. PATENT DOCUMENTS

| | | | | |
|---|---|---|---|---|
| 2007/0296391 A1* | 12/2007 | Bertin | ................. | G01R 35/005 |
| | | | | 323/303 |
| 2008/0218142 A1* | 9/2008 | Uehara | ............. | G01R 19/0092 |
| | | | | 323/282 |
| 2012/0183016 A1* | 7/2012 | Kanai | ..................... | G01K 7/01 |
| | | | | 374/163 |
| 2012/0212194 A1* | 8/2012 | Tachibana | ................ | G05F 3/30 |
| | | | | 323/268 |
| 2014/0176120 A1* | 6/2014 | Aerts | .................... | G01R 1/203 |
| | | | | 324/123 R |
| 2014/0375342 A1* | 12/2014 | Chuah | ............... | G01R 19/0092 |
| | | | | 324/713 |

OTHER PUBLICATIONS

International Search Report and Written Opinion—PCT/US2015/054327—ISA/EPO—May 6, 2016.

\* cited by examiner

HIGH-CURRENT SENSING SCHEME USING DRAIN-SOURCE VOLTAGE

BACKGROUND

Field

Aspects of the present disclosure relate generally to current sensing, and more particularly, to current sensing using drain-source voltage.

Background

Current sensors may be integrated on a chip to monitor current across a chip. For example, a chip may comprise a plurality of blocks (e.g., processing cores, a modem, etc.) and one or more current sensors for each block. In this example, each current sensor may measure the amount of current consumed by the respective block or a portion of the respective block. The current sensors may output their current measurements to a current-management system that manages the blocks based on the current measurements.

For example, the current-management system may compare the measured current for a block to a current threshold. If the measured current exceeds the current threshold, then the current-management system may take steps to reduce the current (e.g., by reducing an operating frequency of the block, shutting down the block, etc.). In this example, the current threshold may be set to a value that prevents the temperature of the chip from becoming too high, which can potentially damage the chip.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a method for measuring current is described herein. The method comprises shorting first and second inputs of an amplifying circuit to generate a first output signal, and converting the first output signal into an offset cancelation value. The method also comprises passing a current through a power switch, wherein the current generates a voltage drop across the power switch, applying the voltage drop across the first and second inputs of the amplifying circuit to generate a second output signal, and converting the second output signal into a current value. The method further comprises subtracting the offset cancelation value from the current value to generate an offset-compensated current value.

A second aspect relates to an apparatus for measuring current. The apparatus comprises means for shorting first and second inputs of an amplifying circuit to generate a first output signal, and means for converting the first output signal into an offset cancelation value. The apparatus further comprises means for passing a current through a power switch, wherein the current generates a voltage drop across the power switch, means for applying the voltage drop across the first and second inputs of the amplifying circuit to generate a second output signal, and means for converting the second output signal into a current value. The apparatus further comprises means for subtracting the offset cancelation value from the current value to generate an offset-compensated current value.

A third aspect relates to a system for measuring current. The system comprises an amplifying circuit having first and second inputs and an output, wherein the first and second inputs are coupled to first and second terminals, respectively, of a power switch. The system also comprises an offset switch coupled between the first and second inputs of the amplifying circuit, an analog-to-digital convert (ADC) coupled to the output of the amplifying circuit, and a processor. During a offset calibration mode, the processor is configured to turn on the offset switch to short the first and second inputs of the amplifying circuit, the amplifying circuit is configured to generate a first output signal in response to the shorted first and second inputs, and the ADC is configured to convert the first output signal into an offset cancelation value. During a current measurement mode, the processor is configured to turn off the offset switch, the amplifying circuit is configured to generate a second output signal in response to a voltage drop across the power switch generated by a current passing through the power switch, the ADC is configured to convert the second output signal into a current value, and the processor is configured to subtract the offset cancelation value from the current value to generate an offset-compensated current value.

A fourth aspect relates to a system for measuring current. The system comprises an amplifying circuit having first and second inputs and an output, and an averaging circuit configured to average a plurality of voltage drops to generate an average voltage drop, wherein each of the voltage drops is generated by a current passing through a respective one of a plurality of power switches, and to output the average voltage drop to the first and second inputs of the amplifying circuit. The system also comprises an analog-to-digital convert (ADC) coupled to the output of the amplifying circuit, wherein the amplifying circuit is configured to generate a first output signal in response to the average voltage drop from the averaging circuit, and the ADC is configured to convert the first output signal into a digital current value.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Current sensors may be integrated on a chip to monitor current across a chip. For example, a chip may comprise a plurality of blocks (e.g., processing cores, a modem, etc.) and one or more current sensors for each block. In this example, each current sensor may measure the amount of current consumed by the respective block or a portion of the respective block. The current sensors may output their current measurements to a current-management system that manages the blocks based on the current measurements.

For example, the current-management system may compare the measured current for a block to a current threshold. If the measured current exceeds the current threshold, then the current-management system may take steps to reduce the current (e.g., by reducing an operating frequency of the block, shutting down the block, etc.). The current threshold may be set to a value that prevents the temperature of the block from becoming too high, which can potentially damage the chip. For example, the current threshold may be set to a value that prevents the chip from entering thermal runaway. Thermal runaway occurs when increases in temperature causes leakage current in the chip to increase, which, in turn, causes further increases in temperature. The resulting positive feedback can cause the temperature of the chip to rapidly increase, potentially damaging the chip.

In another example, the current-management system may estimate a total current for the chip from the current measurements and compare the total current to an upper current limit (e.g., 12 Amps) for the chip. The upper current limit may be imposed by a customer of the chip (e.g., a device manufacturer that incorporates the chip into a device). The customer may impose the upper current limit (e.g., make the upper current limit a condition of using the chip) to prevent the device from overheating and/or malfunctioning. In this example, if the total current approaches the upper current limit, then the current-management system may take steps to prevent the total current from exceeding the upper current limit (e.g., by reducing the operating frequency of one or more blocks, shutting down one or more blocks, etc.).

Figure 1:
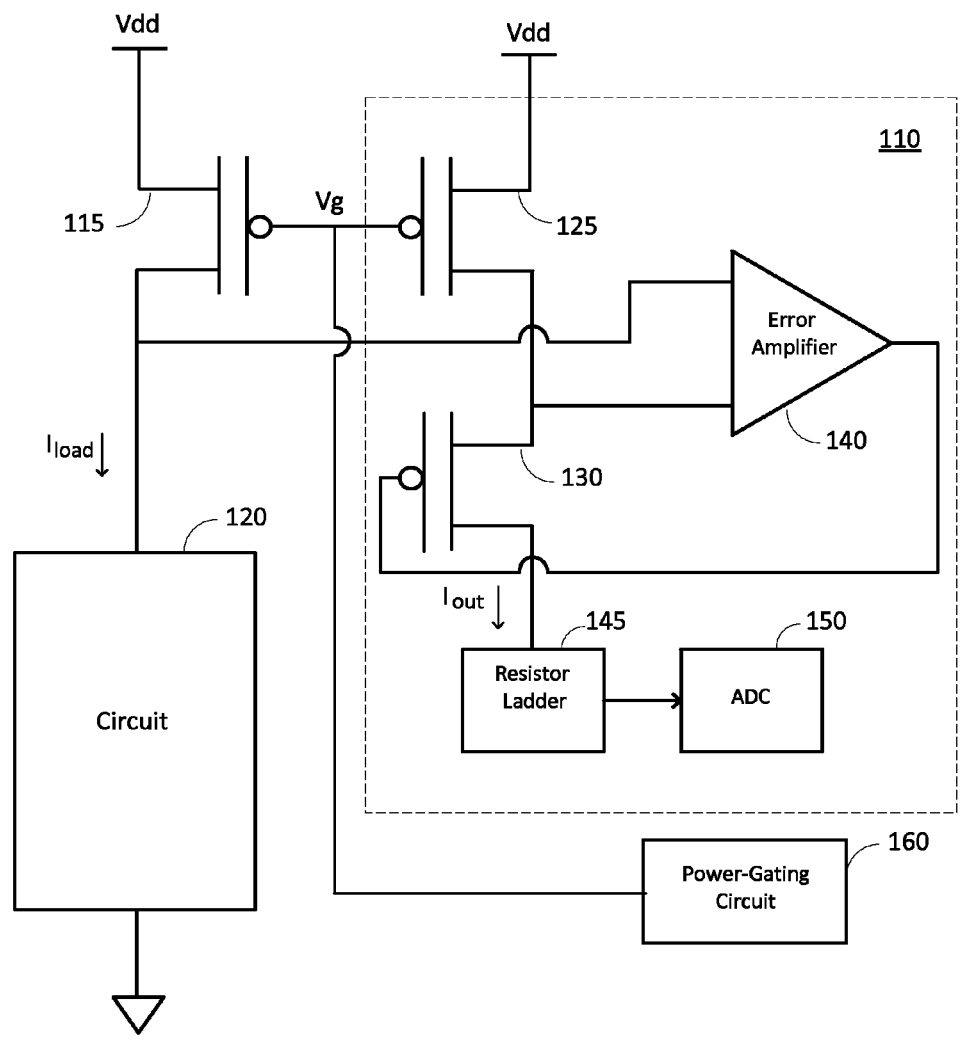
FIG. 1 shows an example of a current sensor.

FIG. 1 below shows an example of a current sensor 110 configured to measure current flow to a circuit 120 (e.g., a processor core). In this example, the circuit 120 is supplied with current from a power-supply rail Vdd through a power switch 115 (also referred to as a bulk head switch). The power switch 115 may comprise a p-type metal-oxide-semiconductor (PMOS) transistor with a source coupled to the power-supply rail Vdd and a drain coupled to the circuit 120, as shown in FIG. 1. The current supplied to the circuit 120 may be referred to as a load current (denoted "$I_{load}$").

A power-gating circuit 160 is configured to power gate the circuit 120 by selectively turning the power switch 115 on and off. For example, the power-gating circuit 160 may turn on the power switch 115 when the circuit 120 (e.g., processor core) is active, and may turn off the power switch 115 when the circuit 120 is inactive (not in use) to reduce leakage current.

In the example in FIG. 1, the power switch 115 comprises a PMOS transistor. In this example, the power-gating circuit 160 controls a gate voltage Vg of the power switch 115 to selectively turn the power switch 115 on and off. More particularly, the power-gating circuit 160 turns on the power switch 115 by pulling down the gate voltage Vg to ground, and turns off the power switch 115 by pulling up the gate voltage Vg to the supply voltage Vdd. It is to be appreciated that the power switch 115 may comprise a plurality of PMOS transistors coupled in parallel, and is therefore not limited to one PMOS transistor.

The current sensor 110 comprises a current-sensing transistor 125 (e.g., PMOS transistor) with a gate coupled to the gate of the power switch 115, which in the example in FIG. 1 comprises a PMOS transistor. The current sensor 110 is configured to generate a scaled-down copy of the load current (denoted "$I_{out}$") passing through the power switch 115. For example, if the current-sensing transistor 125 has a channel width approximately equal to 1/1000 the channel width of the power switch 115, then the current-sensing transistor 125 may generate a current that is approximately equal to 1/1000 the load current. The load current is scaled down in the current sensor 110 to reduce the power consumed by the current sensor 110. It is to be appreciated that FIG. 1 is not drawn to scale, and that the power switch 115 may be much larger than the current-sensing transistor 125, and the circuit 120 (e.g., processor core) may be much larger than the current sensor 110.

The current sensor 110 also comprises an error amplifier 140 and a feedback transistor 130. The error amplifier 140 has a first input coupled to the drain of the power switch 115 (e.g., PMOS transistor), and a second input coupled to the drain of the current-sensing transistor 125 (e.g., PMOS transistor). The feedback transistor 130 (e.g., PMOS transistor) has a source coupled to the drain of the current-sensing transistor 125, and a gate coupled to the output of the error amplifier 140. Coupling the output of the error amplifier 140 to the gate of the feedback transistor 130 forms a feedback loop that causes the error amplifier 140 to adjust the output voltage to the gate of the feedback transistor 130 in a direction that reduces the difference between the drain voltages of the power switch 115 and the current-sensing transistor 125. As a result, the feedback loop forces the drain voltages of the power switch 115 and the current-sensing transistor 125 to be approximately equal (assuming the amplifier 140 has a high gain and a small input offset voltage). This helps ensure that the current of the current-sensing transistor 125 is approximately proportional to the load current passing through the power switch 115.

The current from the current-sensing transistor 125 is input to a resistor ladder 145, which converts the current into a voltage. The voltage is input to an analog-to-digital converter (ADC) 150, which converts the voltage into a digital current value.

In practice, the source-to-drain voltage of the power switch 115 can be very small (e.g., 5 millivolts). This is done to minimize the reduction in the supply voltage at the circuit 120 due to the current-resistor (IR) voltage drop across the power switch 115. As a result, the difference between the source-to-drain voltages of the power switch 115 and the current-sensing transistor 125 needs to be close to zero volts for the current-sensing transistor 125 to accurately produce a scaled-down copy of the load current. A problem is that the input offset voltage of the amplifier 140 may have a magnitude that is comparable to the magnitude of the source-to-drain voltage of the power switch 115. In some cases, the input offset voltage may even be larger than the source-to-drain voltage of the power switch 115. As a result, the source-to-drain voltages of the current-sensing transistor 125 and the power switch 115 can differ by 100% or more, leading to a large error in the current value.

In addition, channel-length mismatches between the power switch 115 and the current-sensing transistor 125 due to process variations can further increase the error. Typically, the power switch 115 has a small channel length (e.g. minimum channel length for a fabrication process) to minimize the IR drop across the power switch 115. The small channel length makes the current value more sensitive to channel-length mismatches.

Another drawback of the current sensor 110 is that the error amplifier 140 typically has a very high gain for the feedback loop. The high gain reduces the bandwidth of the amplifier 140, thereby reducing the bandwidth of the current sensor 110. As a result, the current sensor 110 may not be able to detect high frequency current or current transients (e.g., inrush current) of interest.

Figure 2:
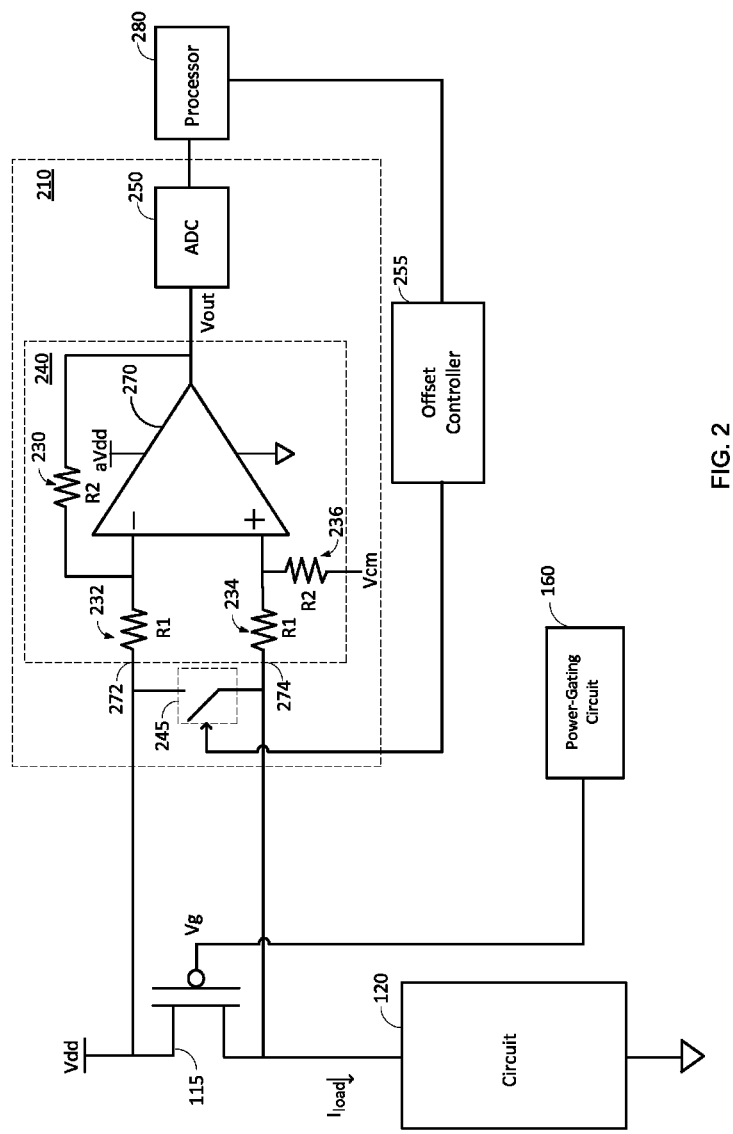
FIG. 2 shows an example of a current sensor comprising an amplifying circuit according to an embodiment of the present disclosure.

FIG. 2 shows a current sensor 210 according to an embodiment of the present disclosure. Instead of generating a scaled-down copy of the load current, the current sensor 210 detects the voltage drop across the power switch 115 (e.g., source-to-drain voltage of the power switch 115), amplifies the detected voltage drop using an amplifying circuit 240, and converts the amplified voltage into a digital current value using an ADC 250. In this embodiment, the voltage drop across the power switch 115 may be approximately proportional to the load current, and therefore can be used to measure the load current. For the example in which the power switch 115 comprises a PMOS transistor, the power switch 115 may be operated in the triode region so that the source-to-drain voltage of the power switch 115 is approximately proportional to the load current.

In one embodiment, the amplifying circuit 240 comprises an operational amplifier 270, a first resistor 230, a second resistor 232, a third resistor 234 and a fourth resistor 236. The first resistor 230 is coupled between the output of the operational amplifier 270 and the minus input of the operational amplifier 270, and the second resistor 232 is coupled between the minus input of the operational amplifier 270 and a first input 272 of the amplifying circuit 240. The third resistor 234 is coupled between the plus input of the operational amplifier 270 and a second input 274 of the amplifying circuit 240, and the fourth resistor 236 coupled between the plus input of the operational amplifier 270 and a voltage Vcm.

In the example in FIG. 2, the second and third resistors 232 and 234 each have a resistance of approximately R1, and the first and fourth resistors 230 and 236 each have a resistance of approximately R2. Assuming the operational amplifier 270 has a very high open loop gain, the gain of the amplifying circuit 240 has a magnitude approximately equal to R2/R1. In one aspect, the magnitude of the gain of the amplifying circuit 240 may be between approximately 10 and 50. In operation, the voltage drop across the power switch 115 is applied across the inputs 272 and 274 of the amplifying circuit 240 so that the amplifying circuit 240 amplifies the voltage drop, as discussed further below.

In the example in FIG. 2, the power switch 115 comprises a PMOS transistor. In this example, the first input 272 of the amplifying circuit 240 is coupled to the source of the power switch 115 and the second input 274 of the amplifying circuit 240 is coupled to the drain of the power switch 115, as shown in FIG. 2. Alternatively, the first input 272 may be coupled to the drain of the power switch 115 and the second input 274 may be coupled to the source of the power switch 115.

In operation, the amplifying circuit 240 amplifies the voltage drop (e.g., source-to-drain voltage) across the power switch 115 to produce an amplified voltage approximately equal to G·(Vdrop), where G is the gain of the amplifying circuit 240 and Vdrop is the voltage drop (e.g., source-to-drain voltage) across the power switch 115. As discussed above, the gain G may have a magnitude of approximately R2/R1. The gain G may be non-inverting or inverting (e.g., depending on whether the source is coupled to the first or second input of the amplifying circuit 240 and whether the drain is coupled to the first or second input of the amplifying circuit 240).

Thus, the amplifying circuit 240 amplifies the voltage drop across the power switch 115, and outputs the amplified voltage drop to the ADC 250, which converts the amplified voltage drop into a digital signal. Since, the voltage drop across the power switch 115 is proportional to the load current passing through the power switch 115, the digital signal of the ADC 250 provides a digital value of the load current.

To prevent the operational amplifier 270 from saturating, the output voltage Vout of the operational amplifier 270 may be shifted by the voltage Vcm to move the output voltage away from the supply rails. This is accomplished by applying the voltage Vcm to one end of the fourth resistor 236, as shown in FIG. 2. The voltage Vcm may be approximately equal to half the supply voltage (denoted "aVdd") of the operational amplifier 270. In this example, the voltage Vcm shifts the output voltage Vout of the operational amplifier 270 by approximately half the supply voltage aVdd, which centers the output voltage between the supply rails. This helps the operational amplifier 270 avoid saturation, and therefore avoid distortion of the amplified signal caused by saturation.

In practice, the operational amplifier 270 may have an input offset voltage that is close in magnitude to the voltage drop (e.g., source-to-drain voltage) being amplified. This is because the voltage drop (e.g., source-to-drain voltage) is relatively small (e.g., a few millivolts) to minimize the reduction in the supply voltage at the circuit 120. As a result, the input offset voltage can lead to a large error at the output of the amplifying circuit 240 if the offset is not canceled out. The input offset voltage may be caused, for example, by component (e.g., transistor) mismatches in the operational amplifier 270, and/or other cause.

In this regard, the current sensor 210 may further comprise an offset switch 245 coupled between the inputs 272 and 274 of the amplifying circuit 240, and an offset controller 255 configured to control the offset switch 245. During an offset calibration mode, the offset controller 255 closes (turns on) the offset switch 245. This shorts the two inputs of the operational amplifier 270, causing the operational amplifier 270 to output a voltage approximately equal to:

$$Vout = Vcm + Vout\_offset \quad (1)$$

where Vout_offset is the offset voltage at the output of the operational amplifier 270. The offset voltage Vout_offset may be positive or negative. The ADC 250 converts the output voltage Vout into a digital value, and outputs the digital value to a processor 280. The processor 280 uses the digital value to perform offset cancelation, as discussed further below. In this regard, the digital value may be referred to as an offset cancelation value.

During a current measurement mode, the offset controller 255 opens (turns off) the offset switch 245. As a result, the voltage drop (e.g., source-to-drain voltage) across the power switch 115 is applied to the inputs of the amplifying circuit 240. The output voltage of the operational amplifier 270 is approximately equal to:

$$Vout = Vcm + Vout\_offset + Vamp \quad (2)$$

where Vamp is the amplified voltage drop. The ADC 250 converts the output voltage Vout into a digital value, and outputs the digital value to the processor 280. The processor 280 subtracts the offset cancelation value from the digital value to cancel out the offset voltage, resulting in an offset-compensated current value corresponding to the amplified voltage drop. Since the amplified voltage drop is approximately proportional to the load current, the offset-compensated current value provides an accurate measurement of the load current. Subtracting the offset cancelation value from the digital value may also cancel out the voltage Vcm, which may be common to both the offset cancelation value and the digital value.

The current sensor 210 may provide one or more of the following advantages over the current sensor 110 in FIG. 1. First, the current sensor 210 may be able to sense current over a larger bandwidth than the current sensor 110 in FIG. 1. As discussed above, the bandwidth of the current sensor 110 in FIG. 1 is reduced by the high gain of the error amplifier 140. In contrast, the amplifying circuit 240 in the current sensor 210 has a smaller gain (e.g., 10 to 50), allowing the current sensor 210 to sense current at higher frequencies (e.g., in the megahertz range).

Another advantage is that the current sensor 210 allows the processor 280 to cancel out the offset voltage of the operational amplifier 270 from the digital output of the ADC 250. This provides accurate current values even when the input offset voltage of the operational amplifier 270 is large relative to the voltage drop across the power switch 115. Further, since the current sensor 210 eliminates the current-sensing transistor 125, the current sensor 210 is not susceptible to error due to channel-length mismatches between the power switch 115 and the current-sensing transistor 125 shown in FIG. 1.

Figure 3:
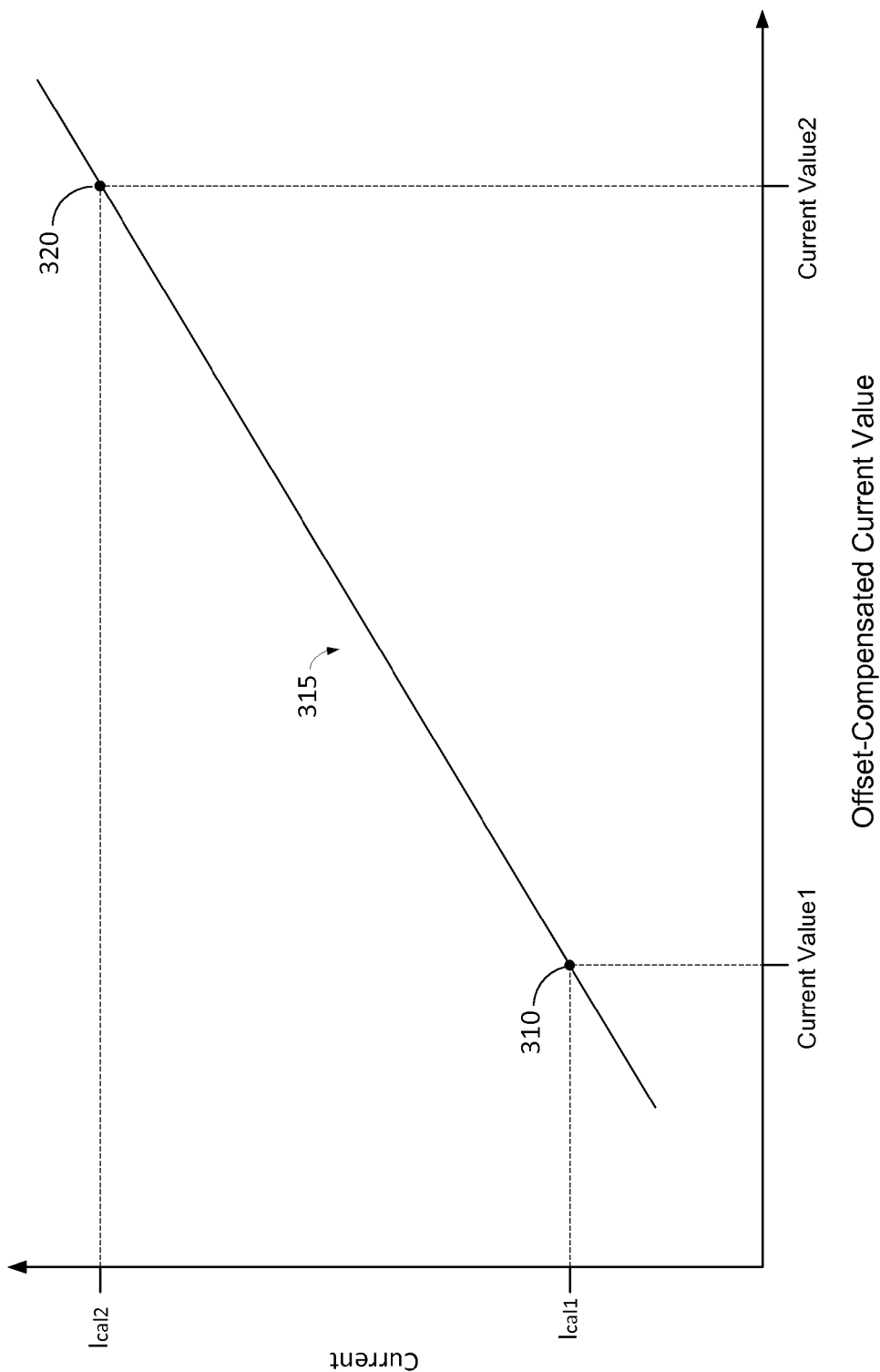
FIG. 3 is a plot illustrating an exemplary current calibration procedure according to an embodiment of the present disclosure.

In some embodiments, the processor 280 may calibrate the current sensor 210 to obtain more accurate current measurements. In this regard, FIG. 3 shows an exemplary plot illustrating load current as a function of offset-compensated current value.

The processor 280 may perform a current calibration procedure for the current sensor 210 as follows. First, a first known calibration current (denoted "$I_{cal1}$") may be supplied to the circuit 120 through the power switch 115. This may be done, for example, by coupling the circuit 120 to a current source configured to supply the first calibration current to the circuit 120. The processor 280 may then receive a corresponding digital value from the ADC 250, and subtract the offset cancelation value from the digital value to obtain a first offset-compensated current value (denoted "current value1"). The first calibration current and the first offset-compensated current value correspond to point 310 in FIG. 3.

A second known calibration current (denoted "$I_{cal2}$") may then be supplied to the circuit 120 through the power switch 115. This may be done, for example, by coupling the circuit 120 to a current source configured to supply the second calibration current to the circuit 120. The processor 280 may then receive a corresponding digital value from the ADC 250, and subtract the offset cancelation value from the digital value to obtain a second offset-compensated current value (denoted "current value2"). The second calibration current and the second offset-compensated current value correspond to point 320 in FIG. 3.

The first and second points 310 and 320 provide the processor 280 with enough information to determine the load current for other offset-compensated current values. This is because load current as a function of offset-compensated current value is approximately given by the line 315 intersecting the first and second points 310 and 320 due to an approximate linear relationship between load current and offset-compensated current value. Thus, after the current calibration procedure is performed, the processor 280 may determine the load current for other offset-compensated current values based on the function determined from the two calibration points 310 and 320.

During normal operation, when the processor 280 receives a digital value from the ADC 250 of the current sensor 210, the processor 280 may first subtract the offset cancelation value from the digital value to obtain a corresponding offset-compensated current value. The processor 280 may then use the function determined from the current calibration procedure to determine the corresponding load current.

In one embodiment, the gain of the amplifying circuit 240 may be adjusted based on the outcome of the current calibration procedure. For example, one of the calibration currents discussed above may correspond to a current level that is equal to or close to the maximum current level that the current sensor 210 is intended to sense for the circuit 120. In this example, when the calibration current is applied, the processor 280 may compare the corresponding digital value from the ADC 250 with a threshold. The threshold may correspond to a digital value at which the output voltage Vout of the operational amplifier 270 is approximately equal to or close to the supply voltage aVdd, which may indicate that the operational amplifier 270 is saturated or close to saturating.

If the digital value is equal to or above the threshold, then the processor 280 may determine that the gain of the amplifying circuit 240 is too high and reduce the gain of the amplifying circuit 240 to avoid saturation. For example, the processor 280 may reduce the gain in half. After reducing the gain of the amplifying circuit 240, the processor 280 may repeat the offset calibration procedure and the current calibration procedure with the reduced gain. In this case, the current sensor 210 operates at the reduced gain. If the digital value is below the threshold, then the processor 280 may keep the gain at its current level. In this case, the current sensor 210 continues to operate at the current gain.

Figure 4:
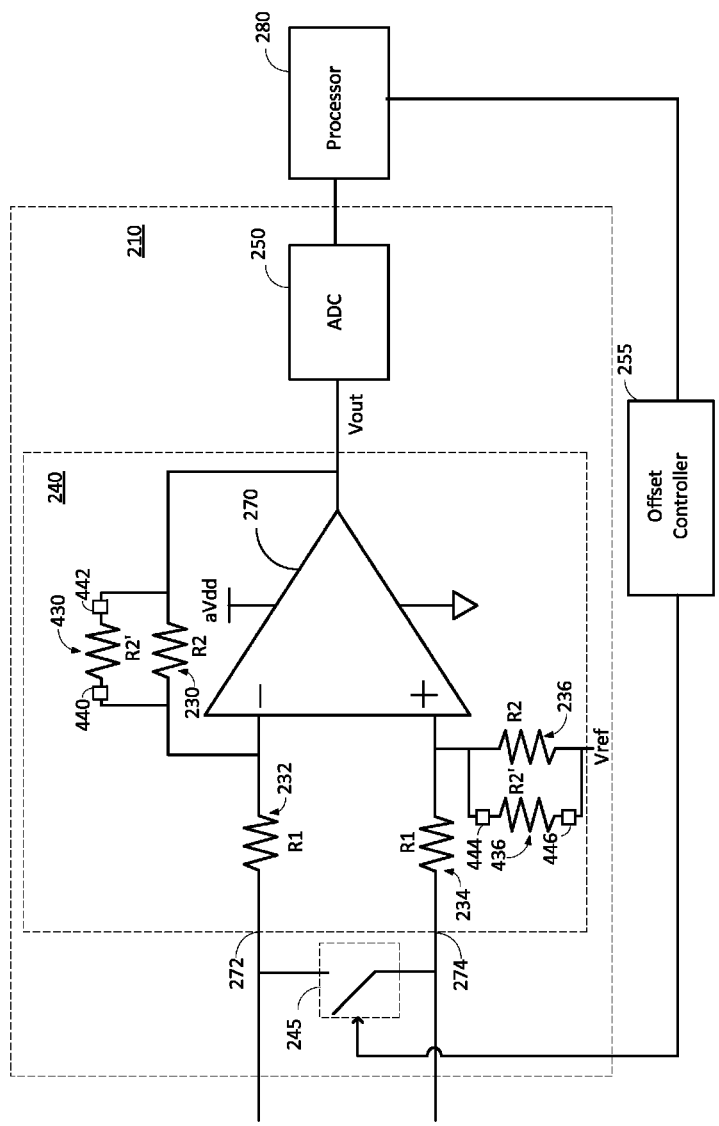
FIG. 4 shows an example of an amplifying circuit with programmable gain according to an embodiment of the present disclosure.

FIG. 4 shows an example of the amplifying circuit 240 with adjustable gain according to one embodiment. In this embodiment, the amplifying circuit 240 further comprises a fifth resistor 430, first and second anti-fuse devices 440 and 442 in series with the fifth resistor 430, a sixth resistor 436, and third and fourth anti-fuse devices 444 and 446 in series with the sixth resistor 436. The fifth and sixth resistors 432 and 434 may each have a resistance of R2'. The anti-fuse devices may be integrated with the resistors and operational amplifier 270.

The anti-fuse devices 440, 442, 444 and 446 are initially open (e.g., have very high resistance). Thus, the initial gain of the amplifying circuit 240 has a magnitude of R2/R1. To reduce the gain, the anti-fuse devices may be shorted, for example, by applying an over voltage to the anti-fuse devices. When this is done, the first and second anti-fuse devices 440 and 442 couple the fifth resistor 430 in parallel with the first resistor 230, and the third and fourth anti-fuse devices 444 and 446 couple the sixth resistor 436 in parallel with the fourth resistor 236. As a result, the gain of the amplifying circuit 240 is reduced to a magnitude of (R2∥R2')/R1. If R2' is equal to R2, then the gain is reduced in half.

In this embodiment, the processor 280 may first perform the current calibration procedure with the initial gain of R2/R1. If the processor 280 determines that the gain is too high, then the processor 280 may reduce the gain by shorting the anti-fuse devices, and repeat the current calibration procedure with the reduced gain. In this embodiment, the gain of the amplifying circuit 240 may be one-time programmable. In other words, when the anti-fuse devices are shorted, they may remain permanently shorted, and hence the gain may be permanently reduced. It is to be appreciated that the present disclosure is not limited to this example, and that the gain of the amplifying circuit 240 may be adjusted using other techniques.

The offset voltage of the operational amplifier 240 may vary over time. For example, the offset voltage may be sensitive to temperature, and therefore change with changes in temperature over time. In this regard, the processor 280 may periodically update the offset cancelation value, as discussed further below.

In one embodiment, the processor 280 may update the offset cancelation value for every N number of digital values from the ADC 250. More particularly, the processor 280 may instruct the offset controller 255 to close the offset switch 245 to perform offset calibration, as discussed above. The processor 280 may store the resulting offset cancelation value in a memory, and instruct the offset controller 255 to open the offset switch 245. The processor 280 may then use the offset cancelation value in the memory to perform offset calibration for the next N digital values from the ADC 250. In other words, for each of the next N digital values from the ADC 250, the processor 280 may subtract the offset cancelation value from the digital value to obtain the corresponding offset-compensated current value. The load current for each offset-compensated current value may be determined using the function obtained from the current calibration procedure discussed above.

After the N digital values, the processor 280 may instruct the offset controller 255 to close the offset switch 245 to perform another offset calibration. The processor 280 may store the resulting updated offset cancelation value in the memory, and instruct the offset controller 255 to open the offset switch 245. The processor 280 may then use the updated offset cancelation value in the memory to perform offset calibration for the next N digital values from the ADC 250. In other words, for each of the next N digital values from the ADC 250, the processor 280 may subtract the updated offset cancelation value from the digital value to obtain the corresponding offset-compensated current value. The load current for each offset-compensated current value may be determined using the function obtained from the current calibration procedure discussed above.

After the N digital values, the processor 280 may repeat the above process. Thus, the offset cancelation value may be updated every N current measurements. The number N may be programmable and may be adjusted, for example, depending on how quickly the offset voltage of the operational amplifier 270 changes over time.

Figure 5:
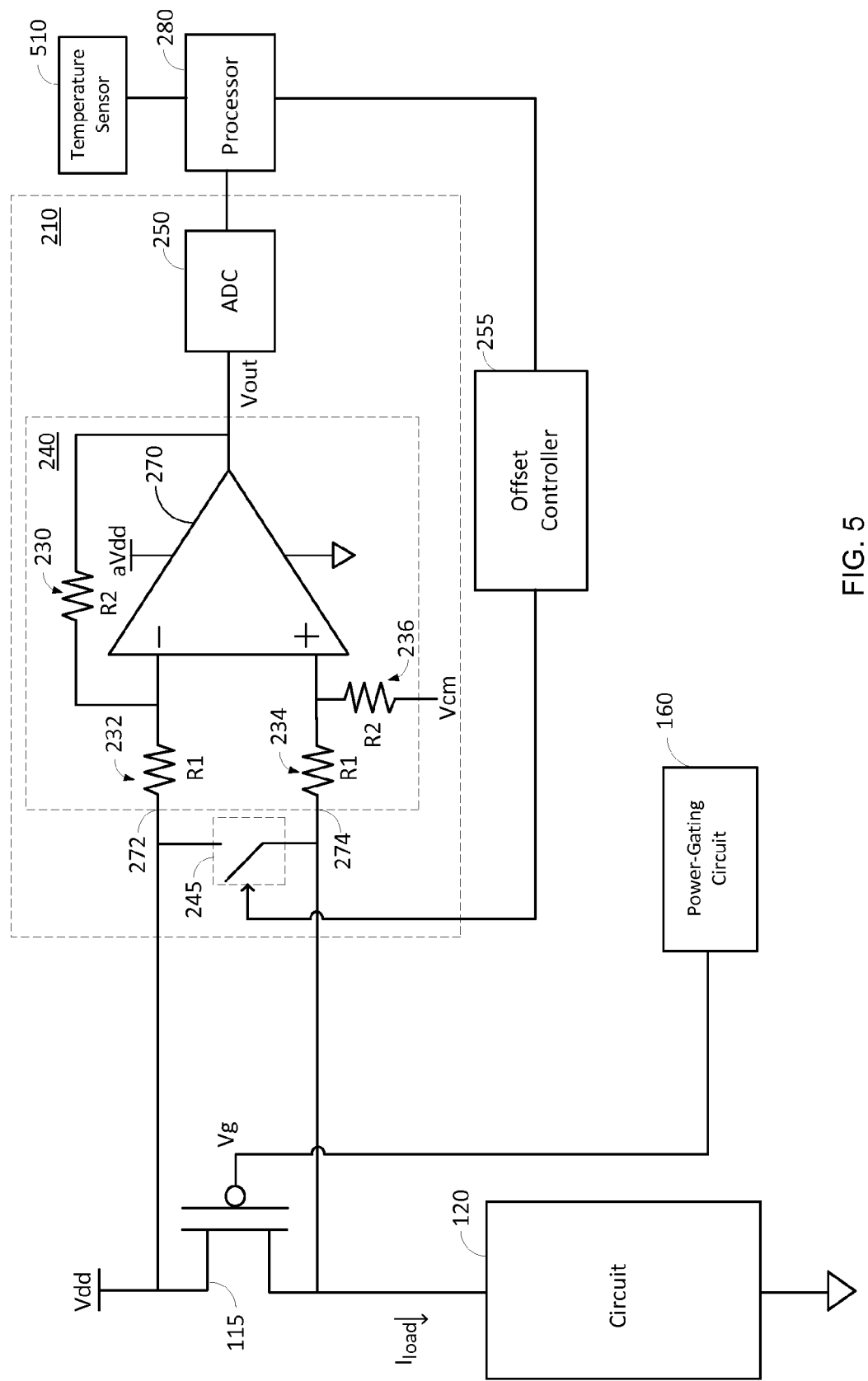
FIG. 5 shows an example of a current sensor and a temperature sensor according to an embodiment of the present disclosure.

As discussed above, the offset voltage of the operational amplifier 270 may change with changes in temperature over time. In this regard, the processor 280 may be coupled to a temperature sensor 510, as shown in FIG. 5. The temperature sensor 510 may be located near the operational amplifier 270 to obtain accurate temperature values for the operational amplifier 270.

In one embodiment, the processor 280 receives temperature values from the temperature sensor 510 and uses the temperature values to monitor the temperature of the operational amplifier 270. For example, when offset calibration is performed, the processor 280 may receive a temperature value from the temperature sensor 510 and associate the temperature value with the resulting offset cancelation value. The processor 280 may then use the offset cancelation value to perform offset cancelation for digital values from the ADC 250, as discussed above. The processor 280 may also periodically receive a temperature value from the temperature sensor 510, and compute a difference between the temperature value and the temperature value associated with the offset cancelation value. If the temperature difference (change) is below a temperature threshold, then the processor 280 may continue using the offset cancelation value to perform offset cancelation. If, however, the temperature difference (change) equals or exceeds the temperature threshold, then the processor 280 may update the offset cancelation value, associate the current temperature value with the updated offset cancelation value, and use the updated offset cancelation value to perform offset cancelation. The processor 280 may repeat the above process for the updated offset cancelation value.

Thus, in this embodiment, the processor 280 may update the offset cancelation value each time the temperature (as sensed by the temperature sensor 510) changes by a predetermined amount since the previous time the offset cancelation value was updated. As a result, the rate at which the offset cancelation value is update depends on how quickly the temperature of the operational amplifier 270 changes over time.

As discussed above, the current sensor 210 may be used in current management applications. For example, a current-management system may use current measurements from the processor 280 to monitor the current to the circuit 120. If the current-management system determines that the current needs to be reduced based on the current measurements (e.g., current exceeds a threshold), then the current-management system may take steps to reduce the current. For example, the current-management system may reduce the current by reducing an operating frequency of the circuit 120. In this example, the operating frequency may be the frequency of a clock signal input to the circuit 120, in which the clock signal is used to switch (toggle) transistors in the circuit 120. In another example, the current-management system may reduce the current by shutting down the circuit 120. This may be done, for example, by instructing the power-gating circuit 160 to turn off the power switch 115. It is to be appreciated that the processor 280 may be part of the current-management system (e.g., the same processor may be used to perform the functions of the processor 280 and the current-management functions described herein).

Figure 6:
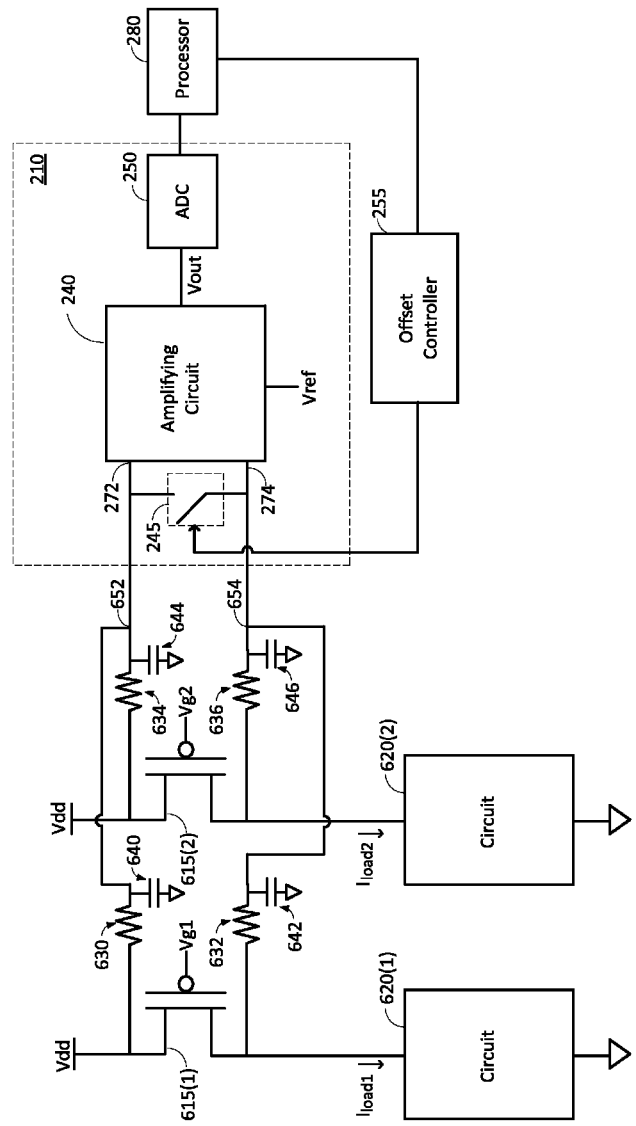
FIG. 6 shows an example of a current sensor configured to measure current through multiple power switches according to an embodiment of the present disclosure.

The current sensor 210 may be configured to measure the total current passing through multiple power switches. In this regard, FIG. 6 shows an example in which the current sensor 210 is configured to measure the total current passing through first and second power switches 615(1) and 615(2). The first power switch 615(1) is coupled between the supply rail Vdd and a first circuit 620(1), and the second power switch 615(2) is coupled between the supply rail Vdd and a second circuit 620(2). Thus, the total current passing through the first and second power switches 615(1) and 6152) is approximately equal to the sum of the current supplied to the first circuit 620(1) (denoted "$I_{load1}$") and the current supplied to the second circuit 620(2) (denoted "$I_{load2}$").

In the example in FIG. 2, each of the power switches 615(1) and 615(2) comprises a PMOS transistor. In this example, the source of the first power switch 615(1) is coupled to the supply rail Vdd and the drain of the first power switch 615(1) is coupled to the first circuit 620(1). The source of the second power switch 615(2) is coupled to the supply rail Vdd and the drain of the second power switch 615(2) is coupled to the second circuit 620(2).

The power-gating circuit 160 (not shown in FIG. 6) may control the gate voltage Vg1 of the first power switch 615(1) to power gate the first circuit 620(1) and may control the gate voltage Vg2 of the second power switch 615(2) to power gate the second circuit 620(2). For example, the power-gating circuit 160 may power gate the first and second circuits 620(1) and 620(2) together by applying the same gate voltage to the first and second power switches 615(1) and 615(2), or power gate the first and second circuits 620(1) and 620(2) independently.

In the example in FIG. 6, the source of the first power switch 615(1) is coupled to a first input node 652 via resistor 630, and the source of the second power switch 615(2) is coupled to the first input node 652 via resistor 634. Thus, the sources of the first and second power switches 615(1) and 615(2) are coupled to a common node (i.e., the first input node 652) via resistors 630 and 634, respectively. Resistors 630 and 634 may have approximately equal resistances. As a result, the voltage at the first input node 652 may be an approximately equal to an average of the source voltages of the first and second power switches 615(1) and 615(2), which may be given by:

$$Vnode1 = \frac{Vs1 + Vs2}{2} \quad (3)$$

where Vnode1 is the voltage of the first input node 652, Vs1 is the source voltage of the first power switch 615(1), and Vs2 is the source voltage of the second power switch 615(2).

The drain of the first power switch 615(1) is coupled to a second input node 654 via resistor 632, and the drain of the second power switch 615(2) is coupled to the second input node 654 via resistor 636. Thus, the drains of the first and second power switches 615(1) and 615(2) are coupled to a common node (i.e., the second input node 654) via resistors 632 and 636, respectively. Resistors 632 and 636 may have approximately equal resistances. As a result, the voltage at the second input node 654 may be an approximately equal to an average of the drain voltages of the first and second power switches 615(1) and 615(2), which may be given by:

$$Vnode2 = \frac{Vd1 + Vd2}{2} \quad (4)$$

where Vnode2 is the voltage of the second input node 364, Vd1 is the drain voltage of the first power switch 615(1), and Vd2 is the drain voltage of the second power switch 615(2).

Thus, the resistors 630, 632, 634 and 636 average the voltage drops (e.g., source-to-drain voltages) across the first and second power switches 615(1) and 615(2), and therefore constitute an averaging circuit. The resulting average voltage drop is applied across the first and second input nodes 652 and 654. In the example in FIG. 6, the first input node 652 is coupled to the first input 272 of the amplifying circuit 240, and the second input node 654 is coupled to the second input 274 of the amplifying circuit 240. Alternatively, the first input node 652 may be coupled to the second input 274 of the amplifying circuit 240, and the second input node 654 may be coupled to the first input 272 of the amplifying circuit 240. In either case, the amplifying circuit 240 amplifies the average voltage drop (e.g., average source-to-drain voltage) across the first and second power switches 615(1) and 615(2). The average voltage drop may be approximately proportional to the total current passing through the first and second power switches 615(1) and 615(2).

The amplifying circuit 240 outputs the amplified average voltage drop to the ADC 250. The ADC 250 converts the amplified average voltage drop into a digital value, and outputs the digital value to the processor 280. Since the total current passing through the first and second power switches 615(1) and 615(2) is approximately equal to the average voltage drop across the first and second power switches 615(1) and 615(2), the digital value may be used to measure the total current, as discussed further below.

In some aspects, the processor 280 may perform an offset calibration procedure to obtain an offset cancelation value, as discussed above. After the offset calibration procedure, the processor 280 may perform a current calibration procedure as follows. First, a first known calibration current may be provided to the supply rail from a current source, and split between the first and second circuits 620(2) and 620(2) through the first and second power switches 615(1) and 615(2), respectively. Thus, in this example, the first calibration current represents the total current passing through the first and second power switches 615(1) and 615(2). The processor 280 may then receive a corresponding digital value from the ADC 250, and subtract the offset cancelation value from the digital value to obtain a first offset-compensated current value.

A second known calibration current may be provided to the supply rail from a current source, and split between the first and second circuits 620(2) and 620(2) through the first and second power switches 615(1) and 615(2), respectively. Thus, in this example, the second calibration current represents the total current passing through the first and second power switches 615(1) and 615(2). The processor 280 may then receive a corresponding digital value from the ADC 250, and subtract the offset cancelation value from the digital value to obtain a second offset-compensated current value.

The processor may then use the first and second offset-compensated current values and the first and second calibration currents to determine total current as a function of offset-compensated current value using linear interpolation, as discussed above. During normal operation, when the processor 280 receives a digital value from the ADC 250 of the current sensor 210, the processor 280 may first subtract the offset cancelation value from the digital value to obtain a corresponding offset-compensated current value. The processor 280 may then use the function determined from the current calibration procedure discussed above to determine the total current passing through the first and second power switches 615(1) and 615(2).

This embodiment may be used to measure current flow to a circuit in cases where current is supplied to the circuit through multiple power switches. This may be done to reduce the current through each power switch, and hence reduce the voltage drop across each power switch. For example, the first and second circuits 620(1) and 620(2) shown in FIG. 6 may be part of a larger circuit. In this example, the current sensor 210 may be used to measure the current to the larger circuit.

It is to be appreciated that, although FIG. 6 shows two power switches 615(1) and 615(2) for ease of illustration, the current sensor 210 may be configured to measure current through a larger number of power switches (e.g., tens or even hundreds of power switches). This may be done by coupling the source of each power switch to the first input node 652 through a respective resistor, and coupling the drain of each power switch to the second input node 654 through a respective resistor. As a result, the average voltage drop (e.g., average source-to-drain voltage) across the power switches appears across the first and second input nodes 652 and 654, in which the average voltage drop may be approximately proportional to the total current passing through the power switches. The amplifying circuit 240 amplifies the average voltage drop, and outputs the amplified average voltage drop to the ADC 250. The ADC 250 converts the amplified average voltage drop into a digital value, and outputs the digital value to the processor 280, which processes the digital value into a current measurement, as discussed above.

In one embodiment, capacitors may be used to filter out high-frequency noise from the circuit 120 (e.g., due to gate switching) or supply rail. The high-frequency noise may be above the desired frequency range for the current sensor 210. In this regard, a first capacitor 640 may be coupled between the source of the first power switch 615(1) and the amplifying circuit 240, a second capacitor 644 may be coupled between the source of the second power switch 615(2) and the amplifying circuit 240, a third capacitor 642 may be coupled between the drain of the first power switch 615(1) and the amplifying circuit 240, and a fourth capacitor 646 may be coupled between the drain of the second power switch 615(2) and the amplifying circuit 240.

Figure 7:
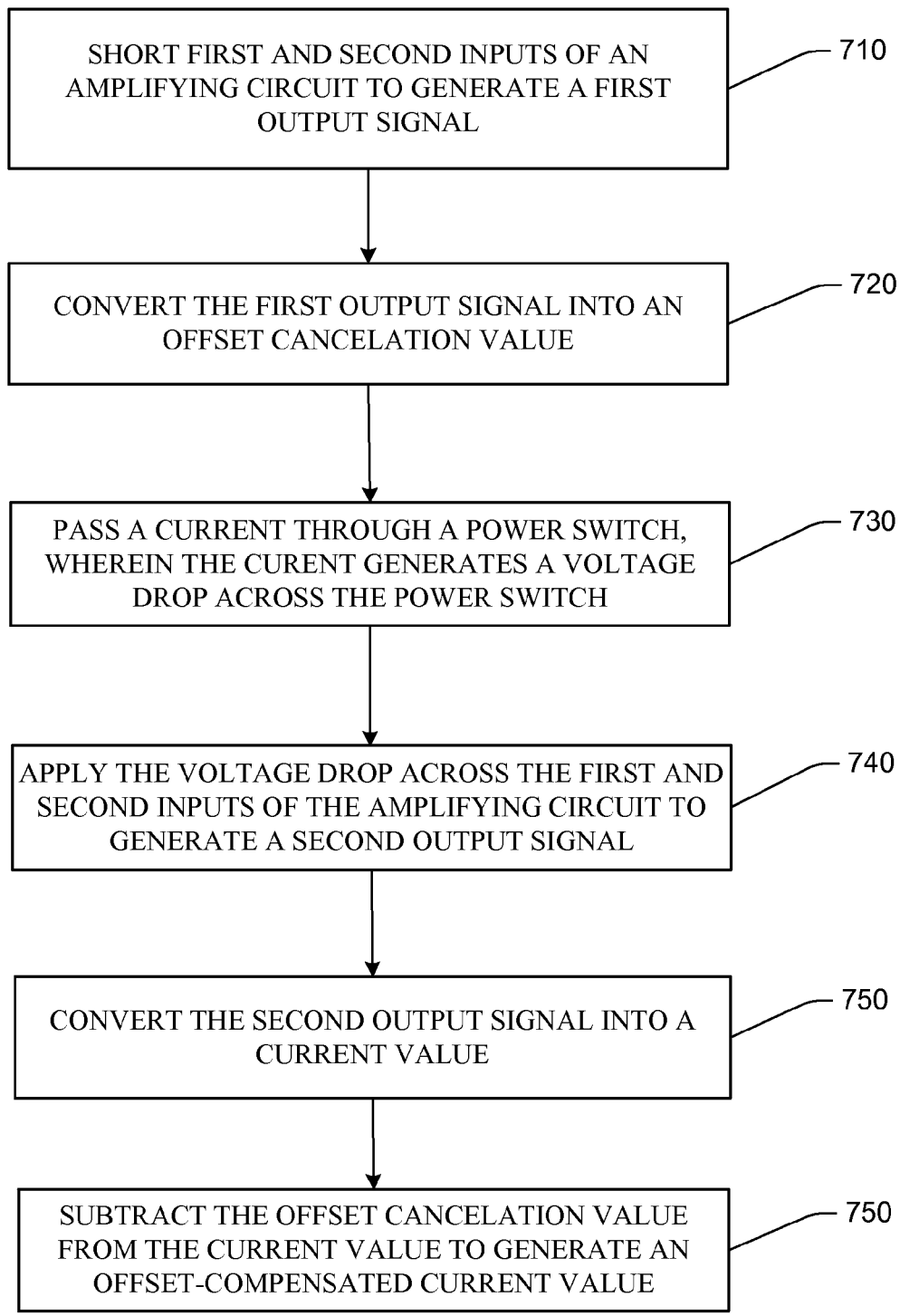
FIG. 7 is a flowchart of a method for measuring current according to an embodiment of the present disclosure.

FIG. 7 shows a method 700 for measuring current according to an embodiment of the present disclosure. The method 700 may be performed, for example, by the current sensor 210 and processor 280.

In step 710, first and second inputs of an amplifying circuit are shorted to generate a first output signal. For example, the first and second inputs (e.g., first and second inputs 272 and 274) of the amplifying circuit (e.g., amplifying circuit 240) may be shorted by closing a switch (e.g., switch 245) between the first and second inputs.

In step 720, the first output signal is converted into an offset cancelation value. For example, the first output signal may be converted into the offset cancelation value by an ADC (e.g., ADC 250).

In step 730, a current passes through a power switch, wherein the current generates a voltage drop across the power switch. For example, the power switch (e.g., power switch 115) may be a PMOS transistor, and the voltage drop may comprise a source-to-drain voltage across the PMOS transistor.

In step 740, the voltage drop is applied across the first and second inputs of the amplifying circuit to generate a second output signal. For example, the voltage drop across the power switch may be coupled to the first and second inputs of the amplifying circuit (e.g., amplifying circuit 240).

In step 750, the second output signal is converted into a current value. For example, the second output signal may be converted into the current value by an ADC (e.g., ADC 250).

In step 760, the offset cancelation value is subtracted from the current value to generate an offset-compensated current value.

The processor 280 may be implemented with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, may be any conventional processor, controller, microcontroller, or state machine. In some implementations, the processor 280 may include a memory for storing code that, when executed by the processor 280, causes the processor to perform the functions described herein. The memory may also be used for storing the offset cancelation value, and current calibration information discussed above. The memory may comprise RAM memory, flash memory, ROM memory, EPROM memory, EEPROM memory, registers, or any other form of storage medium known in the art.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method for measuring current, comprising:
   shorting first and second inputs of an amplifying circuit during an offset calibration mode with a switch controlled with an offset controller to generate a first output signal;
   converting the first output signal into an offset cancelation value;
   passing a current through a power switch during a current measurement mode comprising one or more metal-oxide-semiconductor transistors, wherein the current generates a voltage drop across the power switch comprising a source-to-drain voltage of the one or more metal-oxide-semiconductor transistors;
   applying the voltage drop across the first and second inputs of the amplifying circuit to generate a second output signal, where the first input is coupled to a source of at least one of the one or more metal-oxide-semiconductor transistors and the second input is coupled to a drain of at least one of the one or more metal-oxide-semiconductor transistors;
   converting the second output signal into a current value; and
   subtracting the offset cancelation value from the current value to generate an offset-compensated current value.

2. The method of claim 1, wherein the one or more metal-oxide-semiconductor transistors comprises one or more p-type metal-oxide-semiconductor (PMOS) transistors.

3. The method of claim 1, further comprising shifting an output voltage of the amplifying circuit by a voltage approximately equal to half a supply voltage of the amplifying circuit.

4. The method of claim 1, further comprising:
   detecting a temperature change of the amplifying circuit;

determining whether to update the offset cancelation value based on the detected temperature change; and
updating the offset cancelation value if a determination is made to update the offset cancelation value.

5. The method of claim 4, wherein determining whether to update the offset cancelation value comprises:
comparing the temperature change to a threshold; and
determining to update the offset cancelation value if the temperature change exceeds the threshold.

6. The method of claim 4, wherein updating the offset cancelation value comprises:
shorting first and second inputs of the amplifying circuit to generate a third output signal;
converting the third output signal into an updated offset cancelation value.

7. A method for claim 1, wherein the power switch comprises a plurality of power switches, and wherein passing the current through the power switch comprises:
splitting the current into a plurality of currents; and
passing each of the plurality of currents through a respective one of the plurality of power switches, wherein the current passing through each of the plurality of power switches generates a respective voltage drop;
wherein the method further comprises averaging the voltage drops across the plurality of power switches, and wherein the average of the voltage drops is applied across the first and second inputs of the amplifying circuit to generate the second output signal.

8. The method of claim 7, wherein each of the power switches comprises one or more p-type metal-oxide-semiconductor (PMOS) transistors.

9. The method of claim 8, wherein the voltage drop across each of the power switches comprises a source-to-drain voltage of the respective one or more PMOS transistors.

10. An apparatus for measuring current, comprising:
means for shorting first and second inputs of an amplifying circuit during an offset calibration mode to generate a first output signal;
means for converting the first output signal into an offset cancelation value;
means for passing a current through a power switch during a current measurement mode, wherein the current generates a voltage drop across the power switch, wherein the power switch comprises one or more metal-oxide-semiconductor transistors and the voltage drop comprises a source-to-drain voltage of the one or more metal-oxide-semiconductor transistors;
means for applying the voltage drop across the first and second inputs of the amplifying circuit to generate a second output signal, where the first input is coupled to a source of at least one of the one or more metal-oxide-semiconductor transistors and the second input is coupled to a drain of at least one of the one or more metal-oxide-semiconductor transistors;
means for converting the second output signal into a current value; and
means for subtracting the offset cancelation value from the current value to generate an offset-compensated current value.

11. The apparatus of claim 10, wherein the one or more metal-oxide-semiconductor transistors comprises one or more p-type metal-oxide-semiconductor (PMOS) transistors.

12. The apparatus of claim 10, further comprising means for shifting an output voltage of the amplifying circuit by a voltage approximately equal to half a supply voltage of the amplifying circuit.

13. The apparatus of claim 10, further comprising:
means for detecting a temperature change of the amplifying circuit;
means for determining whether to update the offset cancelation value based on the detected temperature change; and
means for updating the offset cancelation value if a determination is made to update the offset cancelation value.

14. The apparatus of claim 13, wherein the means for determining whether to update the offset cancelation value comprises:
means for comparing the temperature change to a threshold; and
means for determining to update the offset cancelation value if the temperature change exceeds the threshold.

15. The apparatus of claim 14, wherein the means for updating the offset cancelation value comprises:
means for shorting first and second inputs of the amplifying circuit to generate a third output signal; and
means for converting the third output signal into an updated offset cancelation value.

16. The apparatus of claim 10, wherein the power switch comprises a plurality of power switches, and wherein the means for passing the current through the power switch comprises:
means for splitting the current into a plurality of currents; and
means for passing each of the plurality of currents through a respective one of the plurality of power switches, wherein the current passing through each of the plurality of power switches generates a respective voltage drop;
wherein the apparatus further comprises means for averaging the voltage drops across the plurality of power switches, and wherein the average of the voltage drops is applied across the first and second inputs of the amplifying circuit to generate the second output signal.

17. The apparatus of claim 16, wherein each of the power switches comprises one or more p-type metal-oxide-semiconductor (PMOS) transistors.

18. The apparatus of claim 17, wherein the voltage drop across each of the power switches comprises a source-to-drain voltage of the respective one or more PMOS transistors.

19. A system for measuring current, comprising:
an amplifying circuit having first and second inputs and an output, wherein the first and second inputs are coupled to first and second terminals, respectively, of a power switch, wherein the power switch comprises one or more metal-oxide-semiconductor transistors;
an offset switch coupled between the first and second inputs of the amplifying circuit;
an analog-to-digital converter (ADC) coupled to the output of the amplifying circuit; and
a processor;
wherein, during an offset calibration mode, the processor is configured to turn on the offset switch to short the first and second inputs of the amplifying circuit, the amplifying circuit is configured to generate a first output signal in response to the shorted first and second inputs, and the ADC is configured to convert the first output signal into an offset cancelation value, and
wherein, during a current measurement mode, the processor is configured to turn off the offset switch, the amplifying circuit is configured to generate a second output signal in response to a voltage drop across the power switch generated by a current passing through the power switch, the voltage drop comprises a source-to-drain voltage of the one or more metal-oxide-semiconductor transistors with the first input coupled to a source of at least one of the one or more metal-oxide-semiconductor transistors and the second input coupled to a drain of at least one of the one or more metal-oxide-semiconductor transistors, the ADC is configured to convert the second output signal into a current value, and the processor is configured to subtract the offset cancelation value from the current value to generate an offset-compensated current value.

20. The system of claim 19, wherein the one or more metal-oxide-semiconductor transistors comprises one or more p-type metal-oxide-semiconductor (PMOS) transistors.

21. The system of claim 19, further comprising a temperature sensor configured to detect a temperature change of the amplifying circuit, and wherein the processor is further configured to determine whether to update the offset cancelation value based on the detected temperature change, and to update offset cancelation value if a determination is made to update the offset cancelation value.

22. The system of claim 21, wherein the processor is configured to determine whether to update the offset cancelation value by:
  comparing the temperature change to a threshold; and
  determining to update the offset cancelation value if the temperature change exceeds the threshold.

23. A system for measuring current, comprising:
an amplifying circuit having first and second inputs and an output;
an averaging circuit configured to average a plurality of voltage drops to generate an average voltage drop, wherein each of the voltage drops is generated by a current passing through a respective one of a plurality of power switches, and to output the average voltage drop to the first and second inputs of the amplifying circuit, wherein each of the power switches comprises one or more metal-oxide-semiconductor transistors and each of the voltage drops comprises a source-to-drain voltage of the one or more metal-oxide-semiconductor transistors with the first input coupled to a source of at least one of the one or more metal-oxide-semiconductor transistors and the second input coupled to a drain of at least one of the one or more metal-oxide-semiconductor transistors; and
an analog-to-digital converter (ADC) coupled to the output of the amplifying circuit;
wherein the amplifying circuit is configured to generate a first output signal in response to the average voltage drop from the averaging circuit, and the ADC is configured to convert the first output signal into a digital current value.

24. The system of claim 23, wherein the each of the one or more metal-oxide-semiconductor transistors comprises one or more p-type metal-oxide-semiconductor (PMOS) transistors.

25. A system for measuring current, comprising:
an amplifying circuit having first and second inputs and an output;
an offset switch coupled between the first and second inputs of the amplifying circuit;
an averaging circuit configured to average a plurality of voltage drops to generate an average voltage drop, wherein each of the voltage drops is generated by a current passing through a respective one of a plurality of power switches, and to output the average voltage drop to the first and second inputs of the amplifying circuit;
an analog-to-digital converter (ADC) coupled to the output of the amplifying circuit; wherein the ADC is configured to convert the first output signal into a digital current value; and
a processor;
  wherein, during an offset calibration mode, the processor is configured to turn on the offset switch to short the first and second inputs of the amplifying circuit, the amplifying circuit is configured to generate a second output signal in response to the shorted first and second inputs, and the ADC is configured to convert the second output signal into an offset cancelation value, and
  wherein, during a measurement mode, the processor is configured to subtract the offset cancelation value from the current value to obtain an offset-compensated current value.

* * * * *